United States Patent
Oppedahl

(10) Patent No.: US 6,236,685 B1
(45) Date of Patent: May 22, 2001

(54) PRAGMATIC TRELLIS-CODED DIGITAL COMMUNICATION WITH MULTI-STAGE BRANCH METRICS

(75) Inventor: Douglas A. Oppedahl, Scottsdale, AZ (US)

(73) Assignee: SiCOM, Inc., Scottsdale, AZ (US)

( * ) Notice: Subject to any disclaimer, the term of this patent is extended or adjusted under 35 U.S.C. 154(b) by 0 days.

(21) Appl. No.: 09/092,840

(22) Filed: Jun. 5, 1998

(51) Int. Cl.[7] .......................... H04L 23/02; H03M 13/03
(52) U.S. Cl. .......................... 375/265; 375/341; 714/792; 714/796
(58) Field of Search ..................................... 375/261, 262, 375/265, 281, 298, 308, 329, 332, 340, 341; 329/304; 332/103; 714/786, 792, 794, 795, 796

(56) References Cited

U.S. PATENT DOCUMENTS

| | | |
|---|---|---|
| 5,233,629 | 8/1993 | Paik et al. ............................... 375/39 |
| 5,233,630 | 8/1993 | Wolf ....................................... 375/67 |
| 5,396,518 | 3/1995 | How ...................................... 375/265 |
| 5,408,502 | 4/1995 | How ...................................... 375/340 |
| 5,469,452 | 11/1995 | Zehavi .................................... 371/43 |
| 5,497,401 * | 3/1996 | Ramaswamy et al. ............... 375/341 |
| 5,570,391 * | 10/1996 | Lin et al. ............................... 375/265 |
| 5,633,881 | 5/1997 | Zehavi et al. ......................... 371/37.5 |

* cited by examiner

Primary Examiner—Stephen Chin
Assistant Examiner—Betsy L. Deppe
(74) Attorney, Agent, or Firm—Lowell W. Gresham; Jordan M. Meschkow; Meschkow & Gresham, P.L.C.

(57) ABSTRACT

A pragmatic trellis-code modulated digital communications system (20) is provided, in which a demodulator (24) is configured to demodulate a quadrature input signal (62) into an estimation (64) of digital data (54) conveyed thereby. The demodulator (24) includes a branch-metrics generator (74) incorporating a soft-decision generator (82), a delay circuit (86), and a likelihood generator (88); a convolutional encoding circuit; and a hard-decision estimator (78) incorporating a hard-decision generator (98), a selection circuit (104), and an encoding circuit (106). The soft-decision generator (82) generates encoded-bit estimates ($\hat{s}_0, \hat{s}_1$) from the input signal (62). The delay circuit (86) delays one estimate ($\hat{s}_1$) relative to the other ($\hat{s}_0$). The likelihood generator (88) generates likelihoods ($\hat{m}_{00}, \hat{m}_{01}, \hat{m}_{10}, \hat{m}_{11}$) thereof. The convolutional decoding circuit (76) generates a first data-estimation portion (92) therefrom. The hard-decision generator (98) generates uncoded-bit estimate groups ($\hat{e}_{00}, \hat{e}_{01}, \hat{e}_{10}, \hat{e}_{11}$) from the input signal (62). The selection circuit (104) selects one of the groups ($\hat{e}_{00}, \hat{e}_{01}, \hat{e}_{10}, \hat{e}_{11}$) to be a second data estimation portion (94). The convolutional encoding circuit (106) encodes the first data-estimation portion (92) to produce selection-bit estimates ($\hat{c}_0, \hat{c}_1$) with which to control the selection circuit (104).

17 Claims, 3 Drawing Sheets

US 6,236,685 B1

PRAGMATIC TRELLIS-CODED DIGITAL COMMUNICATION WITH MULTI-STAGE BRANCH METRICS

TECHNICAL FIELD OF THE INVENTION

The present invention relates generally to the field of digital communications. More specifically, the present invention relates to pragmatic trellis-code communication with multi-stage branch metrics.

BACKGROUND OF THE INVENTION

Digital communications systems often utilize a quadrature signal modulated as defined by a phase-point constellation to communicate digital information between transmission and reception components. The number of symbols or bits communicated per unit interval of time determines the order of a constellation and the number of phase points contained therein. That is, if N bits are communicated per unit interval of time, then the constellation has an order of $2^N$ and contains $2^N$ phase points.

The quadrature signal may be modulated using either phase shift keying (PSK) or amplitude and phase shift keying (APSK) modulation techniques. Since PSK modulation does not incorporate amplitude variations, intelligence is contained only within the phase of the quadrature signal. Using APSK modulation introduces amplitude as a component of signal intelligence. In other words, the information contained within the quadrature signal is a function of both the amplitude and the phase of the quadrature signal.

APSK constellations may be arranged in a rectangular (R-APSK) or polar (P-APSK) array of phase points. A given 16R-APSK constellation, for example, may have phase points located in a 4×4 grid. The 16-R-APSK constellation is well-known by the name 16-QAM. A given 16-P-APSK, non-QAM, constellation, by contrast, may have phase points in a two-ring, 8/8 equispaced phase-point pattern.

The $2^N$ phase points in a PSK or APSK constellation are functions of the N bits in the digital data per unit interval of time. These bits may be uncoded or encoded. The use of encoded bits is usually preferred as the coding gain produces a significant reduction in the required signal-to-noise ratio of the quadrature input signal. The well-known "Ungerbach" or fully-encoded encoding scheme is often used for this purpose.

However, fully-encoded encoding requires different codes for different orders and types of modulation. This precludes the use of a functional "universal" demodulator. For this reason, pragmatic encoding is desirable. In pragmatic encoding, one or two of the N bits are encoded with the remaining bits per unit interval of time being transmitted uncoded. The well-known K=7, rate ½ convolutional encoding scheme is often used for encoding the one or two encoded bits.

In R-APSK constellations, the modulation along one axis is independent of the modulation along the other axis. That is, each symbol is modulated along either the I axis or the Q axis, but not both. For example, in the above-mentioned 16-R-APSK (i.e., 16-QAM) constellation, two of the four bits control modulation on the I axis and the other two bits control modulation on the Q axis. Since the I and Q axes are orthogonal, each pair of bits has no effect over the other pair. Such a constellation, therefore, is produced through independent bit modulation. Such constellations are moderately successful in the use of pragmatic encoding to increase efficiency.

However, in P-APSK constellations, the modulation along one axis is dependent upon the modulation along the other axis. That is, each bit is modulated along both the I and Q axes. For example, in the above-mentioned 16-P-ASPK constellation, each of the four bits influences modulation on both the I and Q axes. Such a constellation therefore is produced through dependent bit modulation. Using prior-art methodology, a dependent-modulation constellation is complex and presents a significant demodulation difficulty. Additionally, such constellations have not conventionally lent themselves to pragmatic encoding.

With a typical pragmatic encoding scheme having a modulation order of sixteen or more, the output of the encoding circuit is typically two encoded bits per unit interval of time. These encoded bits are passed to a phase mapping circuit, along with N−2 uncoded bits, to produce the quadrature signal to be transmitted.

In the course of transmission, propagation, and reception, the quadrature signal is often corrupted. If this corruption is an instantaneous event or "hit," then at the moment of corruption all bits would be corrupted, possibly beyond recognition.

The simultaneous corruption of all bits by a hit reduces the likelihood of producing a valid estimation of the corrupted bits when encoding is present. This effect may be reduced by interleaving bits relative to each other so as to prevent the simultaneous corruption of all bits by a hit. This is exemplified in U.S. Pat. No. 5,633,881, "Trellis Encoder and Decoder Based Upon Punctured Rate ½ Convolutional Codes," Zahavi et al., hereinafter referred to as "Zahavi." In Zahavi, a fully-encoded PSK modulation and demodulation methodology is taught. An input signal is fully encoded and processed into sets of P bits. The bits in each P-bit set are then interleaved, modulated into a 2P-PSK constellation, and transmitted. In the process of interleaving, each bit is delayed a successive integer number of delay units from zero to P-1, where a delay unit is the amount of delay required to temporally separate the bits in transmission. In this approach, the first bit is delayed zero delay units (i.e., is undelayed), the second bit is delayed one delay unit, and so forth to the last bit, which is delayed P-1 delay units. This methodology causes each bit in the P-bit set to be transmitted during a different delay unit of time, significantly reducing the effect of a hit.

On the receiver side, Zahavi teaches that the quadrature signal is demodulated into a composite hard-decision symbol. This composite hard-decision symbol is then deinterleaved into a set of P bits by delaying it a successive integer number of delay units from P-1 to zero to produce P deinterleaved hard-decision estimates. These P deinterleaved hard-decision estimates are then independently converted into P soft-decision estimates, corresponding to the P-bit set described above. The sets of P-bit estimates are then converted into N bit estimates and decoded into output data corresponding to the original input data.

The methodology taught in Zahavi is sufficient to provide temporal displacement for fully-coded bits. It does, however, suffer in that for large-order constellations, some bits would be delayed a significant number of delay units. For example, in a 64-APSK constellation, the last bit would be delayed five delay units. This large time span significantly increases the possibility that a hit may occur for a given symbol set.

The Zahavi methodology is also limited to use in connection with constellations using independent modulation, e.g., R-APSK constellations. With such constellations, each bit affects either the I component or the Q component of the quadrature signal, but not both. This allows a simple methodology wherein one of the I and Q components is delayed prior to transmission and the other of the I and Q components is delayed after reception.

Unfortunately, this Zahavi methodology is not feasible with constellations using dependent modulation, e.g., P-APSK constellations, as each encoded bit affects both the I and Q components of the quadrature symbol. Hence, a delay of one of the I and Q components affects both encoded bits and fails to produce the requisite temporal offset. For this and other reasons, P-APSK constellations are usually considered undesirable even though they constitute a more efficient usage of the constellation space.

It is therefore a problem of the prior art that constellations utilizing dependent modulation are not readily realizable in optimal configurations.

It is an additional problem of the prior art that pragmatic encoding is impracticable for constellations utilizing dependent modulations.

It is also a problem that practicable temporal-displacement techniques are impracticable for constellations utilizing dependent modulation.

Furthermore, it is a problem of the prior art that efficient large-order constellation demodulators utilizing temporal displacement are not provided.

It is again a problem of the prior art that no universal pragmatic-encoding demodulator is practicable.

SUMMARY OF THE INVENTION

Accordingly, it is an advantage of the present invention that an improved pragmatic trellis-code modulation (PTCM) demodulator and method for a data communication system are provided.

Another advantage of the present invention is that a phase point constellation is demodulated which is suitable for PTCM communication schemes.

Another advantage is that a PTCM data communication system and method are provided which rely upon dependent encoded bits.

The above and other advantages of the present invention are carried out in one form by a system for the transmission and reception of digital data at a rate of N bits per unit interval of time, where N is an integer greater than two. The system includes a modulator configured to accept the digital data and transmit a quadrature signal residing at a phase point within a phase-point constellation and conveying the digital data, wherein the digital data is partitioned within the modulator into uncoded bits and encoded bits, with a first one of the encoded bits being delayed relative to a second one of the encoded bits. The system also includes a demodulator configured to receive the quadrature signal and produce an estimation of the digital data, wherein encoded-bit estimates, correlating to the modulator encoded bits, are derived from the quadrature input signal, with a second one of the encoded-bit estimates delayed relative to a first one of the encoded-bit estimates.

The above and other advantages of the present invention are carried out in another form by a pragmatic trellis-code modulation demodulator for a digital communications system configured to demodulate a quadrature input signal into an estimation of data conveyed therein. The demodulator includes a branch-metrics generator incorporating a soft-decision generator configured to receive the quadrature input signal, a delay circuit coupled to the soft-decision generator, and a likelihood generator coupled to the soft-decision generator through the delay circuit. The demodulator also includes a convolutional decoding circuit coupled to the likelihood generator, which generates a first portion of the data estimation, and a hard-decision estimator configured to generate a second portion of the data estimation in response to the quadrature input signal and the first portion of the data estimation.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

Figure 1:
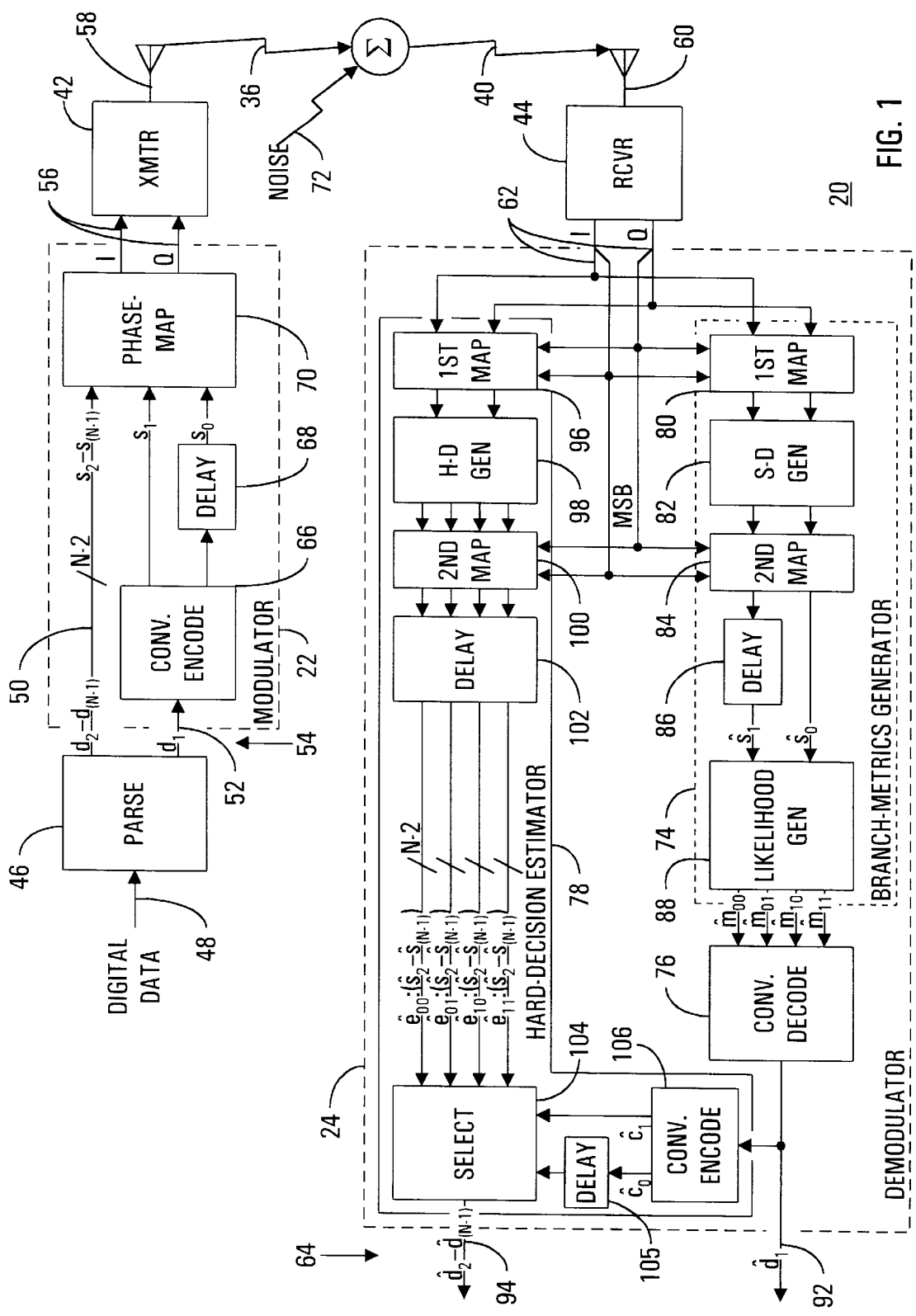
FIG. 1 depicts a block diagram of a digital communications system configured in accordance with a preferred embodiment of the present invention.
Figure 2:
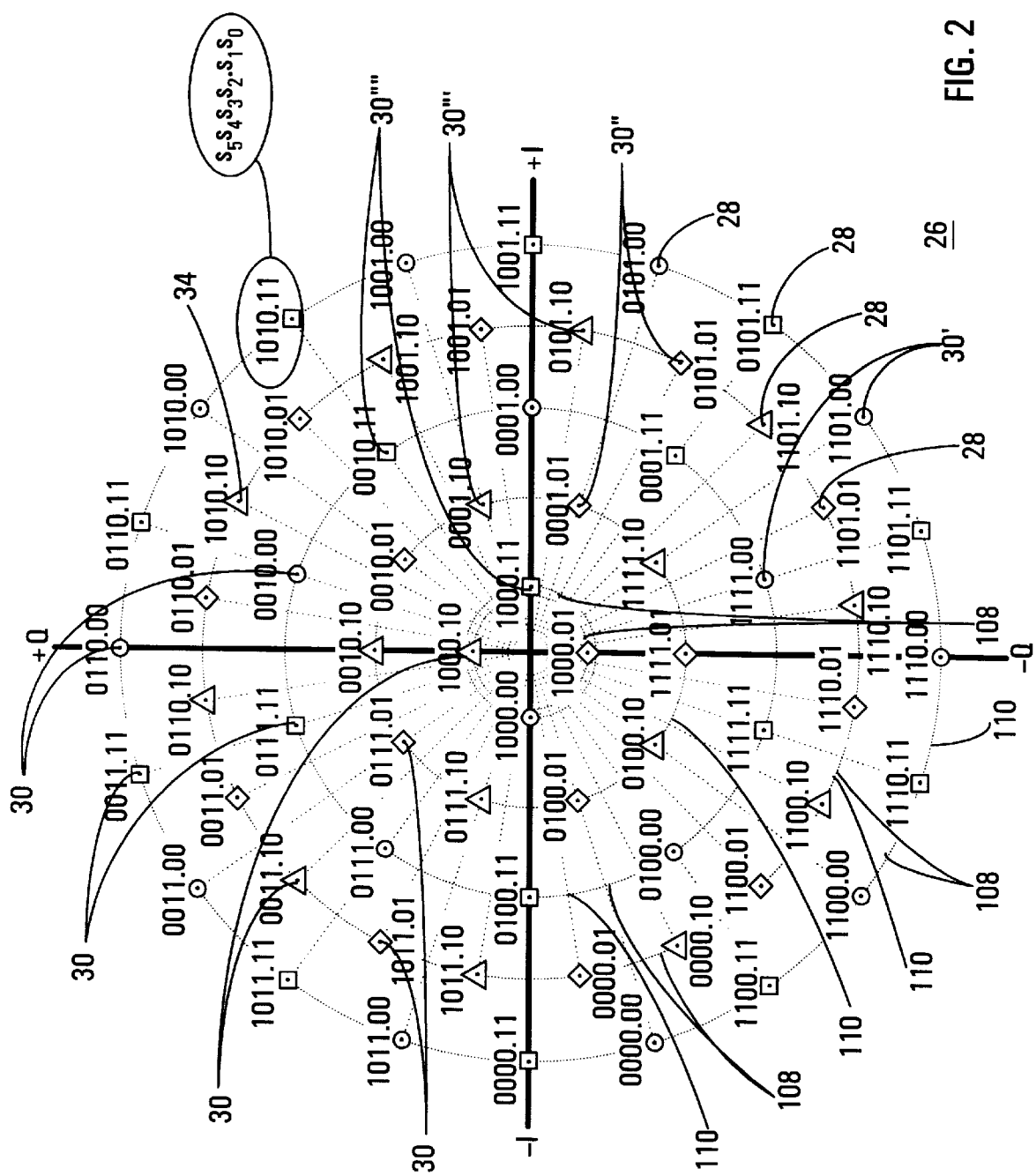
FIG. 2 depicts a 64-P-APSK phase-point constellation with all phase points labeled in accordance with a preferred embodiment of the present invention.
Figure 3:
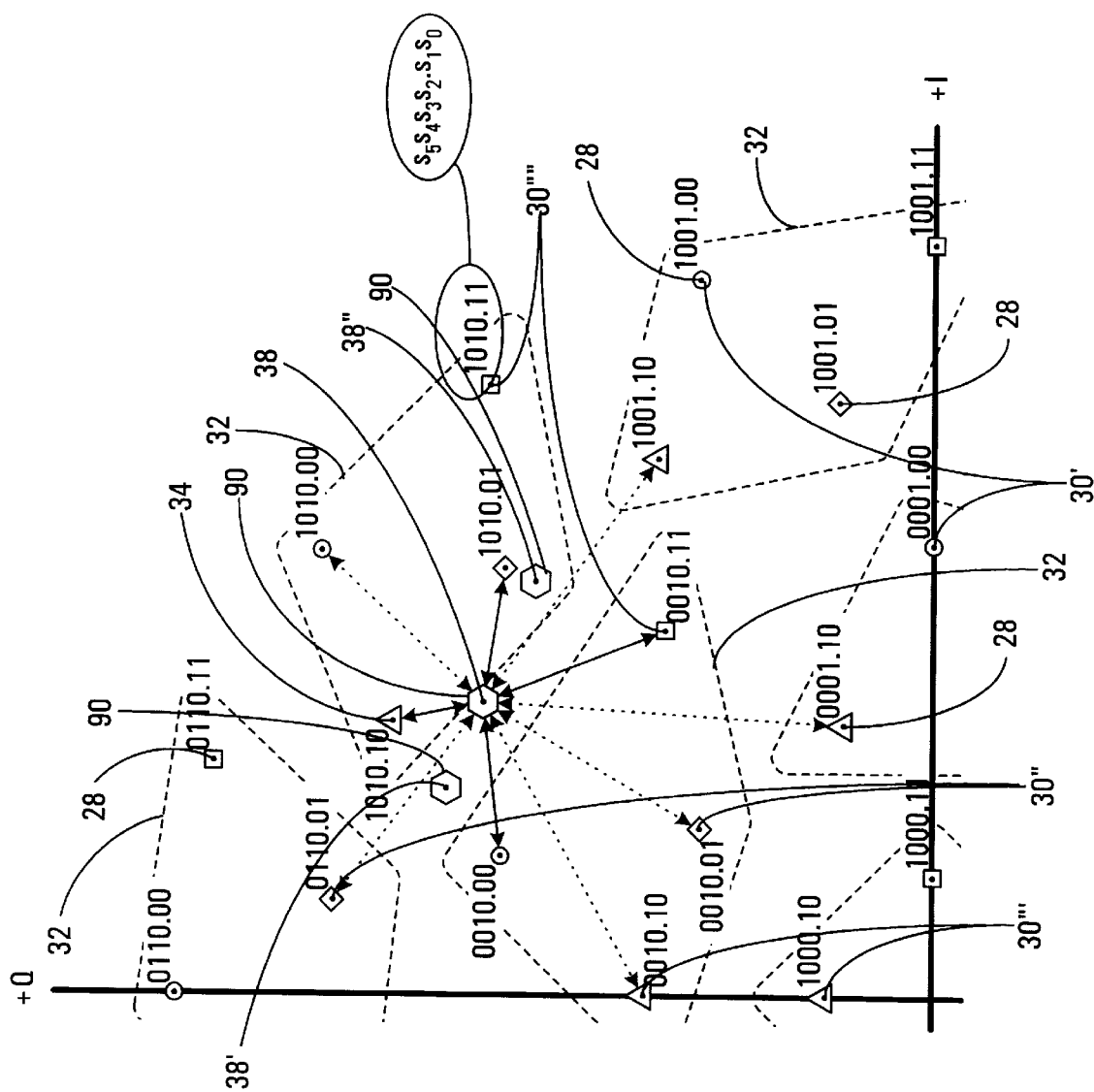
FIG. 3 depicts a portion of the phase-point constellation of FIG. 2 divided into primary and secondary sub-constellations and including exemplary points of reception of a quadrature input signal in accordance with a preferred embodiment of the present invention.

In accordance with a preferred and exemplary embodiment of the present invention, FIG. 1 depicts a block diagram of a pragmatic trellis-code modulation (PTCM) digital communications system 20 containing a modulator 22 and a demodulator 24. FIG. 2 depicts a 64-P-APSK phase-point constellation 26 for use with system 20, with all phase points 28 within constellation 26 labeled in a preferred manner discussed herein. FIG. 3 depicts a portion of phase-point constellation 26 of FIG. 2 divided into primary sub-constellations 30 and secondary sub-constellations 32 and including an exemplary transmission phase point 34 of a quadrature broadcast signal 36 and exemplary reception phase points 38, 38', and 38" of a potentially-corrupted quadrature broadcast signal 40. Phase-point constellation 26 has $2^N$ phase points 28, where N is an integer number of phase points 28 and equals the number of bits conveyed by quadrature broadcast signal 36 between a transmitter 42 and a receiver 44 per unit interval of time. The unit interval of time represents the reciprocal of the baud rate. Over each unit interval of time, the relative phase of quadrature components of quadrature broadcast signal 36 transitions from one set of phase data (i.e. one phase point 28) to another.

Referring to FIG. 1, system 20 includes a parsing circuit 46 coupled to modulator 22, which is then coupled to transmitter 42. Parsing circuit 46, modulator 22, and transmitter 42 are configured to convert a digital input data signal 48 into quadrature broadcast signal 36.

In the exemplary embodiment, digital input data signal 48 includes N−1 bits of data per unit interval of time. These N−1 bits are parsed by parsing circuit 46 into a primary data stream 50 containing N−2 uncoded bits $d_2$ through $d_{(N-1)}$ ($d_2$, $d_3$, $d_4$, and $d_5$ in a constellation where N=6, as shown in FIG. 2) and a secondary data stream 52 containing a single to-be-encoded bit $d_1$ per unit interval of time. Together, primary data stream 50 and secondary data stream S2, i.e., bits $d_1$ through $d_{(N-1)}$, comprise digital data 54. Modulator 22 has as its input digital data 54 and as its output a digital quadrature output signal 56. Transmitter 42 receives quadrature output signal 56 from modulator 22, then pulse shapes, amplifies, and transmits it as quadrature broadcast signal 36 via a transmission antenna 58.

Conversely, receiver 44 receives potentially-corrupted quadrature broadcast signal 40 from transmitter 42 via a reception antenna 60, then amplifies and outputs it as quadrature input signal 62. Demodulator 24 receives quadrature input signal 62 from receiver 44 and demodulates it to produce an estimation 64 of digital data 54. Ideally, digital data estimation 64 is substantially identical to digital data 54.

Modulator 22, and hence system 20, includes a convolutional encoding circuit 66 coupled to parsing circuit 46, a delay circuit 68 coupled to convolutional encoding circuit 66, and a phase-mapping circuit 70 coupled to parsing circuit 46, convolutional encoding circuit 66, and delay circuit 68. Secondary data stream 52, i.e., to-be-encoded bit $d_1$ of digital data 54, is passed to the input of convolutional encoding circuit 66.

In the exemplary embodiment, encoding circuit 66 is a transparent, recursive, K=7, rate ½ convolutional encoder. This results in two encoded bits $s_1$ and $s_0$ being generated for each to-be-encoded bit $d_1$ received from parsing circuit 46.

Those skilled in the art will appreciate that encoding circuit 66 may implement either systematic or non-systematic codes. Also, encoding circuits having other parameters than the above encoder may also be used. In addition, for the purposes of the present invention, encoding circuit 66 may optionally be configured to puncture out encoded data in a manner known to those skilled in the art. Whether or not puncturing is used, encoding circuit 66 generates two bits per unit interval of time in the preferred embodiment.

In the course of transmission, propagation, and reception, quadrature broadcast signal 36 is often corrupted. If this corruption is an instantaneous event or "hit," then at the moment of corruption all bits being propagated would be corrupted, possibly beyond recognition. Delay circuit 68 is used to delay encoded bit $s_0$ relative to encoded bit $s_1$ by one delay unit. A delay unit is an amount of time sufficient to temporally separate bits $s_0$ and $s_1$ within quadrature broadcast signal 36. During the encoding process, an encoder, such as included in convolutional encoding circuit 66, may spread a given bit over as many as seven unit intervals of time. A delay unit in this embodiment, therefore, should be at least seven unit intervals of time. The resultant temporal displacement of encoded bit $s_0$ is effected so that, in the event of a hit upon quadrature broadcast signal 56, the corrupted encoded bit $s_0$ will belong to a different unit interval of time than the bit $s_1$ with which it is associated by virtue of having been generated from a common data bit $d_1$. There is, of course, a bit $s_1$ corrupted simultaneously with the above bit $s_0$, but the corrupted bit $s_1$ is associated with a different bit $s_0$. Those skilled in the art will appreciate that all that is required of delay circuit 68 is a temporal displacement between encoded bits $s_0$ and $s_1$. It matters not, therefore, which bit is delayed as long as appropriate compensation for the temporal displacement is effected in demodulator 24 (discussed below).

Primary data stream 50 from parsing circuit 46 bypasses convolutional encoding circuit 66. Therefore, uncoded bits $d_2$ through $d_{(N-1)}$ in primary data stream 50 remain uncoded. For reasons of labeling consistency, uncoded bits $d_2$ through $d_{(N-1)}$ are redesignated as uncoded bits $s_2$ through $s_{(N-1)}$ ($s_2$, $s_3$, $s_4$, and $s_5$ in a constellation where N=6, as shown in FIG. 2). All N bits, two encoded bits $s_0$ and $s_1$ of secondary data stream 52 and N−2 uncoded bits $s_2$ through $s_{(N-1)}$ of primary data stream 50, are then passed to phase-mapping circuit 70. In each unit interval of time, phase-mapping circuit 70 maps bits $s_0$ through $s_{(N-1)}$ into digital quadrature output signal 56. During each unit interval of time, one phase point 28 within the $2^N$ phase points 28 of constellation 26 define I and Q components of quadrature signal 56. In the exemplary embodiment, phase-mapping circuit 70 is implemented as a memory structured as a look-up table and programmed to accommodate the 64-P-APSK constellation of FIG. 2.

Those skilled in the art will appreciate that by being implemented as a memory look-up table, phase-mapping circuit 70 may readily be programmed to accommodate constellations having differing modulations and modulation orders. The use of a memory look-up table therefore increases the universality of modulator 22.

Quadrature output signal 56 varies continuously in both amplitude (A) and phase ($\phi$) over time. At a sampling instant within a given unit interval of time, quadrature output signal 56 resides at the specific phase point 28 designated by bits $s_0$ through $s_{(N-1)}$. In accordance with a preferred labeling scheme illustrated in FIGS. 2 and 3, for each phase point 28 the digits to the right of the radix point indicate, from right to left, the values of encoded bits $s_0$ and $s_1$ from secondary data stream 52, while the digits to the left of the radix point indicate, from right to left, the values of uncoded bits $s_2$ through $s_{(N-1)}$ from primary data stream 50.

For example, if, during a given unit interval of time in the exemplary embodiment of FIGS. 2 and 3, uncoded bits $s_5$ through $s_2$ together have the value $1010_B$ and encoded bits $s_1$ and $s_0$ together have the value $10_B$, then during that unit interval of time quadrature signal 56 resides at exemplary transmission phase point 34, which bears the preferred designation "1010.10". FIGS. 2 and 3 illustrate one desirable 64-P-APSK modulation which efficiently utilizes the constellation area and demonstrates desirable performance. However, a wide variety of modulations and modulation orders can be adapted for use without departing from either the spirit or the intent of the present invention.

Constellation 26 depicted in FIG. 2 has phase points 28 grouped into primary sub-constellations 30, while the portion of constellation 26 depicted in FIG. 3 has phase points 28 grouped into primary sub-constellation 30 and secondary sub-constellations 32. A primary sub-constellation 30 is made up of phase points 28 defined by all combinations of values for uncoded bits $s_2$ through $s_{(N-1)}$ for a given common value of encoded bits $s_0$ and $s_1$. That is, a primary sub-constellation is represented by the designation "uuuu.ee" where "uuuu" varies through all possible combinations of bit values and "ee" is constant. Since there are two encoded bits $s_0$ and $s_1$, there are four primary sub-constellations 30, with "ee" having one of the values $00_B$, $01_B$, $10_B$ and $11_B$ for each primary sub-constellation 30. In the exemplary constellation 26 depicted in FIGS. 2 and 3, all phase points 28 within a given primary sub-constellation 30 are circumscribed with a unique shape. Circles circumscribe phase points 28 of uuuu.$00_B$ primary sub-constellation 30', diamonds uuuu.$01_B$ primary sub-constellation 30", triangles UUUU.$10_B$ primary sub-constellation 30"', and squares uuuu.$11_B$ primary sub-constellation 30"". For clarity, hexagons are used in FIG. 3 to circumscribe exemplary reception phase points 38, 38', and 38" (discussed later).

Similarly, a secondary sub-constellation 32 (FIG. 3) is made up of phase points 28 defined by all combinations of values of encoded bits $s_0$ and $s_1$ for a given common value of uncoded bits $s_2$ through $s_{(N-L)}$. That is, a secondary sub-constellation 32 is represented by the designation "uuuu.ee" where "uuuu" is constant and "ee" varies through all combinations of bit values. Since there are N−2 uncoded bits $s_2$ through $s_{(N-1)}$, there are $2^{(N-2)}$ secondary sub-constellations 32. Each secondary sub-constellation 32 has one phase point 28 in common with each of the four primary sub-constellations 30', 30'', 30''', and 30''''. Those secondary sub-constellations 32 contained in the portion of constellation 26 depicted in FIG. 3 are shown circumscribed by a dashed-line.

Those skilled in the art will appreciate that the radix point in the preferred phase-point designation discussed above serves only to partition the designation into uncoded and coded bits and has no other significance. Other phase-point designations utilizing other schemes may readily be utilized with equal validity.

Quadrature output signal 56, being the output of modulator 22, is passed to transmitter 42, where it is amplified and transmitted as quadrature broadcast signal 36 for reception by receiver 44. In the course of its passage from transmitter 42 to receiver 44, quadrature broadcast signal 36 often becomes mixed with noise 72 and is altered into potentially-corrupted quadrature broadcast signal 40. Those skilled in the art will appreciate that noise 72, in the sense used herein, may be any contamination, distortion, or alteration of quadrature broadcast signal 36 from its initial transmission form. Such contamination, distortion, or alteration may occur during transmission, propagation, or reception of quadrature broadcast signal 36, and may take the form of any combination of amplitude, frequency, or phase corruption. It is to be understood that potentially-corrupted quadrature broadcast signal 40 is quadrature broadcast signal 36 as received by receiver 44, with or without corruption caused by noise 72 as described.

Receiver 44 receives potentially-corrupted quadrature broadcast signal 40 and, after down-conversion and initial processing, outputs it as digital quadrature input signal 62 to demodulator 24. Quadrature input signal 62 differs from quadrature output signal 56 in that it may be corrupted by noise 72 as defined above. In the preferred embodiment, receiver 44 utilizes a conventional coherent reception scheme which allows absolute references for constellation 26 to be learned over time. Therefore, a shift in the location of quadrature input signal 62 is a shift in the perceived location from the ideal location of exemplary transmission phase point 34 to the location of exemplary reception phase point 38 (FIG. 3).

Those skilled in the art will appreciate, on the assumption that quadrature output signal 56 is located at exemplary transmission phase point 34, quadrature input signal 62 may be located at any point within constellation 26, of which exemplary reception phase point 38 is but one example. The probability of the reception phase point being at any given point may be determined using conventional Gaussian techniques. It follows that the reception phase point would most likely be closer to that phase point 28 which is exemplary transmission phase point 34 than to any other phase point 28. Nevertheless, it is still quite likely that the reception phase point will be closer to another phase point 28 than to exemplary transmission phase point 34. It will be understood that the location of exemplary reception phase point 38 (and of exemplary reception phase points 38' and 38'' [discussed later]) is for purposes of example only as an aid in the teaching of the present invention.

Referring to FIG. 1, demodulator 24 is a pragmatic trellis-code modulation (PCTM) demodulator. Demodulator 24, and hence system 20, includes a multi-stage branch-metrics generator 74 coupled to receiver 44, a convolutional decoding circuit 76 coupled to branch-metrics generator 74, and a hard-decision estimator 78 coupled to both receiver 44 and convolutional decoding circuit 76. Quadrature input signal 62 is passed to the inputs of both branch-metrics generator 74 and hard-decision estimator 78.

Branch-metrics generator 74, hence demodulator 24 and system 20, includes a first soft-decision mapping circuit 80 coupled to receiver 44, a soft-decision generator 82 coupled to receiver 44 through first mapping circuit 80, a second soft-decision mapping circuit 84 coupled to generator 82, a soft-decision delay circuit 86 coupled to generator 82 through second mapping circuit 84, and a likelihood generator 88 coupled to delay circuit 86 and to generator 82 through second mapping circuit 84. Branch metrics generator 74 is configured to accept quadrature input signal 62 and produce encoded-bit branch-metric likelihoods $\hat{m}_{00}$, $\hat{m}_{01}$, $\hat{m}_{10}$, and $\hat{m}_{11}$.

In accordance with conventional independent-modulation techniques, ignoring sector mapping, soft-decision generator 82 and likelihood generator 88 would be incorporated into a single table constituting branch-metrics generator 74. However, branch-metrics generator 74 is configured to have multiple stages. An initial stage is provided by soft-decision generator 82, a middle stage is provided by delay circuit 86, and a final stage is provided by likelihood generator 88. Branch-metrics generator 74 compensates for the temporal displacement produced by delay circuit 68 in modulator 22 for dependent modulations as well as for independent modulations. The incorporation of soft-decision mapping circuits 80 and 84 into branch-metrics generator 74 affects neither the scope nor the intent of the present invention.

Quadrature input signal 62 is expressed as a pair of independent signal components. When viewed as orthogonal Cartesian components, they are an in-phase (I) component and a quadrature-phase (Q) component. When viewed as polar components, they are an amplitude (A) component and a phase angle ($\phi$) component. A Cartesian component viewpoint is used throughout this discussion. Those skilled in the art will appreciate that the manner in which these components are viewed is irrelevant to the present invention.

Quadrature input signal 62 is passed to first soft-decision mapping circuit 80, soft-decision generator 82, and second soft-decision mapping circuit 84. Working together, mapping circuits 80 and 84 and generator 82 generate encoded-bit estimates $\hat{s}_0$ and $\hat{s}_1$. In P-APSK constellations, such as that exemplified in FIGS. 2 and 3, the modulation along one axis is dependent upon the modulation along the other axis. That is, phase-mapping circuit 70 modulates each bit in both the I and Q axes. For example, in 64-P-ASPK constellation 26, each of the six bits controls modulation on both the I and Q axes. Because of the component interdependence inherent in each phase point 28 of P-APSK constellation 26, each of encoded-bit estimates $\hat{s}_1$ and $\hat{s}_0$ is a function of both the I and Q components of quadrature input signal 62.

In the preferred embodiment, soft-decision generator 82 is essentially a memory structured as a look-up table. Generator 82, in conjunction with mapping circuits 80 and 84, is implemented so as to partition constellation 26 into 16,384 elements or areas 90, of which three examples are shown in FIG. 3. Regardless of where located in constellation 26, quadrature input signal 62 resides within one of elements 90. Generator 82 is pre-programmed so as to provide encoded-bit estimates $\hat{s}_1$ and $\hat{s}_0$ as a function of the element 90 in which quadrature input signal 62 resides.

Those skilled in the art will appreciate that by being implemented as a memory look-up table, generator 82 may readily be programmed to accommodate constellations having differing modulations and modulation orders. The use of a memory look-up table therefore increases the universality of demodulator 24.

Encoded-bit estimates $\hat{s}_1$ and $\hat{s}_0$ represent soft-decisions of the estimated values of encoded bits $s_1$ and $s_0$. Each encoded-bit estimate $\hat{s}_1$ or $\hat{s}_0$ contains a plurality of bits: three bits in the exemplary embodiment. These bits indicate the state of the bit estimate and the degree of confidence of that state.

Exemplary reception phase point 38 is located nearly midway between the phase points designated $1010.10_B$ and $1010.01_B$, but is slightly closer to the former. If quadrature input signal 62 were located at point 38, encoded-bit estimates $\hat{s}_0$ and $\hat{s}_1$ might represent the states $0_B$ and $1_B$, respectively, with only moderate confidence, as the phase points designated $1010.10_B$ and $1010.01_B$ have differing values for both bit estimates $\hat{s}_0$ and $\hat{s}_1$, and point 38 is only slightly closer to the phase point designated $1010.10_B$. On the other hand, exemplary reception phase point 38' is located exactly at the midpoint of a line between the phase points designated $1010.10_B$ and $0010.00_B$. If quadrature input signal 62 were located at point 38', then encoded-bit estimate so might represent a state of $0_B$ with a maximal confidence while encoded-bit estimate $\hat{s}_1$ might represent a state of $1_B$ with a minimal confidence, as the phase points designated $1010.10_B$ and $0010.00_B$ have the same value ($0_B$) for bit estimate $\hat{s}_0$ and different values for bit estimate $\hat{s}_1$. Similarly, exemplary reception phase point 38" is located far closer to the phase point designated $1010.01_B$ than any other phase point. If quadrature input signal 62 were located at point 38", encoded-bit estimates $\hat{s}_0$ and $\hat{s}_1$ might represent the states $1_B$ and $0_B$, respectively, with high confidence. The soft-decision values of encoded-bit estimates $\hat{s}_0$ and $\hat{s}_1$ generated by soft-decision generator 82 are estimates, and may not represent the values of actual bits $s_0$ and $s_1$ from modulator 22. It is the task of decoding circuit 76 (discussed later) to determine the correct value.

Those skilled in the art will appreciate that other numbers of bits per symbol estimate and that various confidence encoding schemes may be used without departing from either the scope or the intent of the present invention.

Soft-decision mapping circuits 80 and 84 are used with soft-decision generator 82 to allow sector mapping to be used to reduce the size of the look-up table contained within generator 82. Through the use of mapping circuits 80 and 84, generator 82 need only have a look-up table for a sector of constellation 26 subtending 360/X degrees, where X is the number of mirror-identical sectors into which the phase-point constellation may be divided. In the exemplary embodiment, constellation 26 may be divided into four mirror-identical sectors (quadrants). Therefore, through the use of mapping circuits 80 and 84, generator 82 need only have a look-up table of 4,096 elements 90 instead of 16,384.

The most-significant bits (MSB) of the I and Q components of quadrature input signal 62 are passed to soft-decision mapping circuits 80 and 84. This allows constellation 26 to be divided into X sectors of 360/X degrees. The remaining bits are correlated in first soft-decision mapping circuit 80, thus folding all sectors of constellation 26 into one mapped sector. Since constellation 26 has had all sectors mapped into one, soft-decision generator 82 need only possess a memory look-up table big enough for that one mapped sector. The resultant encoded-bit estimates are then decorrelated by soft-decision mapping circuit 84 to produce encoded-bit estimates $\hat{s}_0$ and $\hat{s}_1$. In the exemplary embodiment, X is four, and each sector has 90°, i.e., is a quadrant. Those skilled in the art will recognize that mapping for other than four sectors is feasible. Other mapping schemes and, should mapping not be desirable, the elimination of mapping circuits 80 and 84 does not depart from either the scope or the intent of the present invention.

As discussed above, delay circuit 68 in modulator 22 was used to delay encoded bit $s_0$ relative to encoded bit $s_1$ by one delay unit in order to minimize the chances that a hit upon quadrature signal 56 during propagation would simultaneously corrupt both encoded bits $s_1$ and $s_0$ for a given unit interval of time. This is effected because bits $s_0$ and $s_1$, occupy different unit intervals of time, and are not simultaneously corrupted by the same instantaneous hit. That is, the bit $s_0$ corrupted by a given hit is associated with a bit $s_1$ that was transmitted one delay unit earlier, and the bit $s_1$ corrupted by that hit is associated with a bit $s_0$ that will not be transmitted for one delay unit.

To compensate for this inter-bit temporal displacement, soft-decision delay circuit 86 delays encoded-bit estimate $\hat{s}_1$ by one delay unit relative to encoded-bit estimate $\hat{s}_0$. Since each encoded-bit estimate $\hat{s}_0$ or $\hat{s}_0$ is a function of both the I and the Q components of quadrature input signal 62, the delay of encoded-bit estimate $\hat{s}_1$ occurs after encoded-bit estimates $\hat{s}_0$ and $\hat{s}_1$ have been generated, i.e., after soft-decision generator 82.

Encoded-bit estimates $\hat{s}_0$ and $\hat{s}_1$, with encoded-bit estimate $\hat{s}_1$ delayed by delay circuit 86, are submitted as inputs to a likelihood generator 88, which then produces a likelihood for each of the four possible states of encoded-bit estimates $\hat{s}_0$ and $\hat{s}_1$. These four possible encoded-bit likelihoods, $\hat{m}_{00}$, $\hat{m}_{01}$, $\hat{m}_{10}$, and $\hat{m}_{11}$, represent multi-bit likelihood values for each of the four possible states. Like soft-decision generator 82, likelihood generator 88 is essentially a memory structured as a pre-programmed look-up table. Multi-stage branch-metrics generator 74 includes soft-decision generator 82, delay circuit 86, and likelihood generator 88 together.

Encoded-bit likelihoods $\hat{m}_{00}$, $\hat{m}_{01}$, $\hat{m}_{10}$, and $\hat{m}_{11}$ are passed to the input of convolutional decoding circuit 76. Decoding circuit 76 generates a first portion 92 of digital data estimation 64, first data-estimation portion 92 being decoded-data estimate $\hat{d}_1$ for each unit interval of time. Decoded-data estimate $\hat{d}_1$ is an estimate of to-be-coded bit $d_1$ as output from parsing circuit 46 in modulator 22.

Quadrature input signal 62 is also passed to the input of hard-decision estimator 78. Hard-decision estimator 78 includes a first hard-decision mapping circuit 96, a hard-decision generator 98, a second hard-decision mapping circuit 100, a hard-decision delay circuit 102, a selection circuit 104, a delay circuit 105, and a convolutional encoding circuit 106. Hard-decision estimator 78 is configured to produce a second portion 94 of digital-data estimation 64 in response to quadrature input signal 62 and first data-estimation portion 92.

Quadrature input signal 62 is passed to first hard-decision mapping circuit 96, hard-decision generator 98, and second hard-decision mapping circuit 100. Working together, mapping circuits 96 and 100 and generator 98 generate four uncoded-bit estimate groups $\hat{e}_{00}$, $\hat{e}_{01}$, $\hat{e}_{10}$, and $\hat{e}_{11}$, i.e., one for each of the possible encoded phase-point designations $00_B$, $01_B$, $10_B$, and $11_B$, or one for each of the four primary sub-constellations 30', 30", 30''', and 30''''.

Each of uncoded-bit estimate groups $\hat{e}_{00}$, $\hat{e}_{01}$, $\hat{e}_{10}$, and $\hat{e}_{11}$ contains N−2 uncoded-bit estimates $\hat{s}_2$ through $\hat{s}_{(N-1)}$. Each uncoded-bit estimate group $\hat{e}_{00}$, $\hat{e}_{01}$, $\hat{e}_{10}$, or $\hat{e}_{11}$ designates the specific phase point 28 closest to reception phase point 38 and having that encoded-bit estimate designation. In the exemplary embodiment, where N equals six, the phase points designated $0010.00_B$, $1010.01_B$, $1010.10_B$, and $0010.11_B$ are the phase points in two different primary sub-constellations 30 closest to reception phase point 38. Therefore, hard-decision generator 98 generates four (N–2) uncoded-bit estimate groups $\hat{e}_{00}$, $\hat{e}_{01}$, $\hat{e}_{10}$, and $\hat{e}_{11}$ having the values $0010_B$, $1010_B$, $1010_B$, and $0010_B$, respectively, with the four digits in each estimate group being, from right to left, the values for uncoded-bit estimates $\hat{s}_2$, $\hat{s}_3$, $\hat{s}_4$, and $\hat{s}_5$, respectively.

For the same reasons as discussed above for soft-decision generator 82, each of uncoded-bit estimates $\hat{s}_2$ through $\hat{s}_{(N-1)}$ in each of uncoded-bit estimate groups $\hat{e}_{00}$, $\hat{e}_{01}$, $\hat{e}_{10}$, and $\hat{e}_{11}$ is a function of both the I and Q components of quadrature input signal 62.

As with soft-decision generator 82, hard-decision mapping circuits 96 and 100 are used with hard-decision generator 98 to allow sector mapping to be used to reduce the size of the look-up table contained within generator 98. Through the use of mapping circuits 96 and 100, generator 98 need only have a look-up table for a sector of constellation 26 subtending 360/X degrees, where X is the number of mirror-identical sectors into which the phase-point constellation may be divided. In the exemplary embodiment, constellation 26 may be divided into four mirror-identical sectors (quadrants). Therefore, through the use of mapping circuits 96 and 100, generator 98 need only have a look-up table of 4,096 elements 90 instead of 16,384.

The most-significant bits (MSB) of the I and Q components of quadrature input signal 62 are passed to hard-decision mapping circuits 96 and 100. This allows constellation 26 to be divided into X sectors of 360/X degrees. The remaining bits are correlated in first hard-decision mapping circuit 96, thus folding all sectors of constellation 26 into one mapped sector. Since constellation 26 has had all sectors mapped into one, hard-decision generator 98 need only possess a memory look-up table big enough for that one mapped sector. The resultant uncoded-bit estimate groups are then decorrelated by hard-decision mapping circuit 100 to produce uncoded-bit estimate groups $\hat{e}_{00}$, $\hat{e}_{01}$, $\hat{e}_{10}$, and $\hat{e}_{11}$. In the exemplary embodiment, X is four, and each sector has 90°, i.e., is a quadrant. Those skilled in the art will recognize that mapping for other than four sectors is feasible. Other mapping schemes and, should mapping not be desirable, the elimination of mapping circuits 96 and 100 does not depart from either the scope or the intent of the present invention.

Generator 98 is pre-programmed so as to provide uncoded-bit estimate groups $\hat{e}_{00}$, $\hat{e}_{01}$, $\hat{e}_{10}$, and $\hat{e}_{11}$ as a function of the element 90 in which quadrature input signal 62 resides. Uncoded-bit estimates $\hat{s}_{(N-1)}$ through $\hat{s}_2$ within uncoded-bit estimate groups $\hat{e}_{00}$, $\hat{e}_{01}$, $\hat{e}_{10}$, and $\hat{e}_{11}$ represent hard-decisions of the estimated values of uncoded bits $s_{(N-1)}$ through $s_2$ in modulator 22.

The propagation through soft-decision delay circuit 86, likelihood generator 88, and convolutional decoding circuit 76 requires a significant number of unit intervals of time. This propagation time is accounted for in order that all portions of digital data estimation 64 be in synchronization with each other. This is accomplished in the exemplary embodiment by hard-decision delay circuit 102, which individually delays each of uncoded-bit estimate groups $\hat{e}_{00}$, $\hat{e}_{01}$, $\hat{e}_{10}$, and $\hat{e}_{11}$ by an amount equal to this propagation time. In this manner, uncoded-bit estimates $\hat{s}_{(N-1)}$ through $\hat{s}_2$ within each of uncoded-bit estimate groups $\hat{e}_{00}$, $\hat{e}_{01}$, $\hat{e}_{10}$, and $\hat{e}_{11}$ are synchronized with decoded-data estimate $\hat{d}_1$ from convolutional decoding circuit 76.

The desirous group of uncoded-bit estimate groups $\hat{e}_{00}$, $\hat{e}_{11}$, $\hat{e}_{10}$, and $\hat{e}_{11}$ is selected by a selection circuit 104. Selection circuit 104 is controlled by the output of a convolutional encoding circuit 106 substantially identical to convolutional encoding circuit 66 in modulator 22. Convolutional encoding circuit 106 generates selection-bit estimates $\hat{c}_1$ and $\hat{c}_0$ from decoded-data estimate $\hat{d}_1$. Selection-bit estimates $\hat{c}_1$ and $\hat{c}_0$ are derived from decoded-data estimate $\hat{d}_1$ and are effectively equivalent to encoded bits $s_1$ and $s_0$ in modulator 22. As with delay circuit 68 in modulator 22, delay circuit 105 delays selection-bit estimate $\hat{c}_0$ so that the temporal displacement between selection-bit estimates $\hat{c}_1$ and $\hat{c}_0$ is the same as the temporal displacement between encoded bits $s_0$ and $s_1$.

Selection-bit estimates $\hat{c}_1$ and $\hat{c}_0$ are control signals for selection circuit 104. The outputs of selection circuit 104 are uncoded-data estimates $\hat{d}_{(N-1)}$ through $\hat{d}_2$, which together are a second portion 94 of digital data estimation 64. Those skilled in the art will appreciate that uncoded-data estimates $\hat{d}_2$ through $\hat{d}_{(N-1)}$ are synonymous with uncoded-bit estimates $\hat{s}_2$ through $\hat{s}_{(N-1)}$ in the selected uncoded-bit estimate group $\hat{e}_{00}$, $\hat{e}_{01}$, $\hat{e}_{10}$, or $\hat{e}_{11}$ prior to selection. Being uncoded, i.e., not requiring processing by convolutional decoding circuit 76, there is no logical difference between them.

Uncoded-data estimates $\hat{d}_2$ through $\hat{d}_{(N-1)}$ are estimates of uncoded bits $d_2$ through $d_{(N-1)}$, respectively, as output from parsing circuit 46 in modulator 22. Digital data estimation 64, comprising N–1 data estimates $d_1$ through $d_{(N-1)}$, is the output of demodulator 24.

The scenario depicted above for the exemplary embodiments of modulator 22 and demodulator 24 has been simplified for clarity. Those skilled in the art will recognize that variations may be incorporated without departing from either the scope or the intent of the present invention.

For example, phase-point constellation 26, as depicted in the exemplary embodiment of FIGS. 2 and 3, is not rotationally invariant. Should rotational invariance be desirous, differential encoding circuits (not shown) may be placed into modulator 22 in positions to differentially encode digital data in primary and secondary data streams 50 and 52, i.e., bits $d_1$ through $d_{(N-1)}$. Correspondingly, differential-decoding circuits (not shown) may be inserted into demodulator 24 in position to differentially decode first and secondary portions 92 and 94 of digital-data estimation 64. Such differential encoding and decoding circuits are well known to those skilled in the art.

Similarly, bit puncturing may readily be incorporated by the modification of convolutional encoding circuit 66 to include puncture control circuitry (not shown), expanding likelihood generator 88 into multiple look-up tables (not shown) to handle both unpunctured and punctured bits, the inclusion of puncture-detection and symbol-steering circuitry (not shown) into likelihood generator 88, and, since convolutional encoding circuit 106 is substantially identical to convolutional encoding circuit 66, the inclusion of puncture-control circuitry (not shown) into convolutional encoding circuit 106.

Phase-point constellation 26, as exemplified in FIGS. 2 and 3, is a non-rotationally-invariant sixty-four phase point polar amplitude phase-shift keyed (64-P-APSK) constellation. That is, constellation 26 has sixty-four phase points 28 arranged in at least two concentric ring pairs 108 with like numbers of phase points 28 in each ring 110 of each ring pair 108. Constellation 26 is depicted as a 20/20/10/10/2/2 constellation, i.e., as having sixty-four phase points 28 in three ring pairs 108 of, from outside inward, twenty, ten, and two phase points 28 per ring 110, respectively. Constellation 26 may, for some purposes, be considered a 20/20/10/10/4 constellation, i.e., as having inner ring pair 108 treated as a single ring 110 of four phase points 28. Those skilled in the art will appreciate that other P-APSK constellations may be incorporated. For example, a rotationally-invariant 64-P-APSK 24/24/12/12 constellation or a 16-P-APSK 8/8 constellation may easily be implemented.

Those skilled in the art will also appreciate that demodulator 24, while intended for P-APSK constellations, will also process rectangular amplitude phase-shift keyed (R-APSK) and other PSK constellations, such as 64-R-APSK (64-QAM), 32-R-APSK (32-QAM), 16-R-ASPK (16-QAM), 16-PSK, and 8-PSK. This ability to process constellations using other forms of APSK and PSK modulations renders the present invention into a universal demodulator.

In summary, the present invention provides an improved pragmatic trellis-coded modulation (PTCM) digital communications system 20 including a modulator 22 and a demodulator 24. Modulator 22 and demodulator 24 are configured to process either PSK or APSK signals, and function with either independent modulations (R-APSK or QAM) or dependent modulations (P-APSK). The use of split branch-metrics generator 74 in demodulator 24 allows the temporal displacement of dependent-modulation bits in modulator 22. This temporal displacement inhibits the loss of intelligence should an instantaneous all-bit corruption occur during propagation between modulator 22 and demodulator 24, i.e., within or between transmitter 42 and receiver 44. Compensation for the temporal displacement is effected within multi-stage branch-metrics generator 74 within demodulator 24.

Although the preferred embodiments of the invention have been illustrated and described in detail, it will be readily apparent to those skilled in the art that various modifications may be made therein without departing from the spirit of the invention or from the scope of the appended claims.

What is claimed is:

1. In a digital communications system, a pragmatic trellis-code modulation demodulator configured to demodulate a quadrature input signal into an estimation of data conveyed by said quadrature input signal, said demodulator comprising:
   a branch-metrics generator which includes a soft-decision generator configured to receive said quadrature input signal, a delay circuit coupled to said soft-decision generator, and a likelihood generator coupled to said soft-decision generator through said delay circuit;
   a convolutional decoding circuit coupled to said likelihood generator of said branch-metrics generator, said decoding circuit generating a first portion of said data estimation; and
   a hard-decision estimator configured to generate a second portion of said data estimation in response to said quadrature input signal and said first portion of said data estimation.

2. A demodulator as claimed in claim 1 wherein:
   said quadrature input signal is expressed as a pair of independent signal components defining a position of said quadrature input signal within a phase-point constellation having $2^N$ phase points, where N is an integer number, and said quadrature input signal conveys N bits of data per unit interval of time; and
   said soft-decision generator is configured to generate a pair of encoded-bit estimates from said quadrature input signal, wherein each of said encoded-bit estimates is a function of both components of said pair of independent components.

3. A demodulator as claimed in claim 2 wherein:
   said soft-decision generator is configured so that said phase-point constellation comprises a plurality of said phase points arranged in at least two concentric rings, wherein the outermost pair of concentric rings possesses an equal number of said phase points per ring.

4. A demodulator as claimed in claim 2 wherein:
   said phase-point constellation has X symmetrical sectors, wherein X is an integer number and each of said sectors subtends 360/X degrees;
   for each unit interval of time, said quadrature input signal resides in one sector of said X sectors;
   said branch-metrics generator additionally comprises a first soft-decision mapping circuit coupled to said soft-decision generator and configured to translate said quadrature input signal from said one sector to a mapped sector;
   said soft-decision generator is configured as a look-up table which receives said quadrature input signal mapped within said mapped sector; and
   said branch-metrics generator additionally comprises a second soft-decision mapping circuit configured to compensate said encoded-bit estimates for said translation performed by said first soft-decision mapping circuit.

5. A demodulator as claimed in claim 2 wherein said delay circuit is configured to delay a first one of said pair of encoded-bit estimates relative to a second one of said pair of encoded-bit estimates.

6. A demodulator as claimed in claim 5 wherein said relative delay is greater than seven unit intervals of time.

7. A demodulator as claimed in claim 1 wherein said hard-decision estimator comprises:
   a convolutional encoding circuit coupled to said convolutional decoding circuit and configured to produce selection data;
   a hard-decision generator configured to receive said quadrature input signal and generate hard-decision data; and
   a selection circuit coupled to said convolutional encoding circuit and said hard-decision generator.

8. A demodulator as claimed in claim 7 wherein:
   said phase-point constellation has X symmetrical sectors, wherein X is an integer number and each of said sectors subtends 360/X degrees;
   for each unit interval of time, said quadrature input signal resides in one sector of said X sectors;
   said hard-decision estimator additionally comprises a first hard-decision mapping circuit coupled to said hard-decision generator and configured to translate said quadrature input signal from said one sector to a mapped sector;
   said hard-decision generator is configured as a look-up table which receives said quadrature input signal mapped within said mapped sector; and
   said hard-decision estimator additionally comprises a second hard-decision mapping circuit configured to compensate said hard-decision data for said translation performed by said first hard-decision mapping circuit.

9. A demodulator as claimed in claim 7 wherein:
   said quadrature input signal is expressed as a pair of independent signal components defining a position of said quadrature input signal within a phase-point constellation having $2^N$ phase points, where N is an integer number and said quadrature input signal conveys N bits of data per unit interval of time;
   said N bits comprise two encoded bits defining four primary sub-constellations;

said hard-decision generator is configured to generate four uncoded-bit estimates, wherein each of said uncoded-bit estimates comprises N−2 bits and each of said uncoded-bit estimates is configured to be a function of both components of said pair of independent components; and said selection circuit is configured to select one of said four uncoded-bit estimates.

10. A demodulator as claimed in claim 9 wherein said selection circuit utilizes said selection data to select one of said uncoded-bit estimates.

11. A system for the communication of digital data at a predetermined number of bits per unit interval of time, wherein said system comprises:

a modulator configured to accept said digital data and produce a quadrature signal characterized by a phase point within a phase-point constellation for each unit interval of time and convey said digital data, wherein said digital data is partitioned within said modulator into uncoded bits and encoded bits, with a first one of said encoded bits being delayed relative to a second one of said encoded bits; and a demodulator configured to receive said quadrature signal and produce an estimation of said digital data, wherein encoded-bit estimates correlated to said modulator encoded bits are derived from said quadrature input signal, and wherein said demodulator comprises:

a soft-decision generator configured to accept said quadrature signal and produce said encoded-bit estimates;

a delay circuit configured to delay a second one of said encoded-bit estimates relative to a first one of said encoded-bit estimates;

a likelihood generator configured to produce likelihoods of said encoded-bit estimates;

a convolutional decoding circuit configured to decode said likelihoods so as to produce a first portion of said data estimation; and a hard-decision estimator configured to generate a second portion of said data estimation in response to said quadrature input signal and said first portion of said data estimation.

12. A system for the communication of digital data at a rate of N−1 bits per unit interval of time, where N is an integer greater than two, wherein said system comprises:

a modulator configured to accept said digital data and produce a quadrature signal characterized by one phase point for each unit interval of time, said one phase point being selected from a phase-point constellation having $2^N$ of said phase points, and to convey said digital data, wherein said digital data is partitioned within said modulator into uncoded bits and encoded bits, with a first one of said encoded bits being delayed relative to a second one of said encoded bits; and a demodulator configured to receive said quadrature signal and produce an estimation of said digital data, wherein encoded-bit estimates correlated to said modulator encoded bits are derived from said quadrature input signal, wherein said demodulator comprises:

a soft-decision generator configured to accept said quadrature signal and produce two encoded-bit estimates per unit interval of time;

a delay circuit configured to delay a second one of said encoded-bit estimates relative to a first one of said encoded-bit estimates;

a likelihood generator configured to produce likelihoods of encoded-bit estimates;

a convolutional decoding circuit configured to decode said likelihoods and generate a first portion of said data estimation; and a hard-decision estimator configured to generate a second portion of said data estimation in response to said quadrature input signal and said first portion of said data estimation.

13. A system as claimed in claim 12 wherein said hard-decision estimator comprises:

a convolutional encoding circuit configured to encode said first portion of said data estimation so as to produce selection-bit estimates;

a hard-decision generator configured to receive said quadrature input signal and generate four uncoded-bit group estimates; and a selection circuit configured to utilize said selection-bit estimates to select one of said four uncoded-bit group estimates so as to produce said second portion of said data estimation.

14. A system as claimed in claim 12 wherein said modulator 22 is configured so that said phase-point constellation comprises a plurality of said phase points arranged in at least two concentric rings, wherein the outermost pair of concentric rings possesses an equal number of said phase points per ring.

15. A method for the demodulation of a pragmatic trellis-code modulation (PTCM) quadrature input signal into an estimation of digital data conveyed by said quadrature input signal, said quadrature input signal being expressed as a pair of independent signal components defining, per unit interval of time, a position of said quadrature input signal within a phase-point constellation having $2^N$ phase points, where N is an integer number, and said quadrature input signal conveys N bits per unit interval of time, said method comprising:

a) generating, from said quadrature input signal, two encoded-bit estimates, wherein each of said encoded-bit estimates is a function of both components of said pair of independent components;

b) delaying a first one of said encoded-bit estimates relative to a second one of said encoded-bit estimates;

c) generating, from said encoded-bit estimates, likelihoods of a first portion of said digital data estimation;

d) convolutionally decoding said likelihoods to produce a first portion of said digital data estimation; and e) generating, from said quadrature input signal and said first portion of said digital data estimation, a second portion of said digital data estimation.

16. A method as claimed in claim 15 wherein said generating activity e) comprises:

f) encoding said first portion of said digital data estimation to produce selection-bit estimates;

g) generating, from said quadrature input signal, four uncoded-bit group estimates, wherein each of said uncoded-bit group estimates is a function of both components of said pair of independent components and contains N−2 bits; and h) selecting, in response to said selection bits, one of said uncoded-bit group estimates to produce said second portion of said digital data estimation.

17. A method as claimed in claim wherein said generating step a) is configured so that said phase-point constellation comprises a plurality of said phase points arranged in at least two concentric rings, wherein the outermost pair of concentric rings possesses an equal number of said phase points per ring.

* * * * *

UNITED STATES PATENT AND TRADEMARK OFFICE
CERTIFICATE OF CORRECTION

PATENT NO. : 6,236,685 B1
DATED : May 22, 2001
INVENTOR(S) : Douglas A. Oppedahl It is certified that error appears in the above-identified patent and that said Letters Patent is hereby corrected as shown below:

Column 4,
Line 66, please replace "S2" with -- 52 --.

Column 10,
Line 24, please replace the second occurrence of "$S_0$" with -- $S_1$ --.

Column 16,
Line 60, please insert the number -- 16 -- after "claim"

Signed and Sealed this

Fourteenth Day of May, 2002

Attest:

JAMES E. ROGAN
*Attesting Officer*  *Director of the United States Patent and Trademark Office*